(12) United States Patent  
Li

(10) Patent No.: US 7,902,935 B2
(45) Date of Patent: Mar. 8, 2011

(54) BIAS CIRCUIT AND VOLTAGE-CONTROLLED OSCILLATOR

(75) Inventor: Yunhai Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 60 days.

(21) Appl. No.: 12/204,724

(22) Filed: Sep. 4, 2008

(65) Prior Publication Data

US 2009/0066409 A1 Mar. 12, 2009

(30) Foreign Application Priority Data

Sep. 7, 2007 (CN) .......................... 2007 1 0146075

(51) Int. Cl.
*G05F 1/10* (2006.01)
*H03L 1/00* (2006.01)

(52) U.S. Cl. ............................. 331/185; 331/57; 327/538

(58) Field of Classification Search .................. 331/185, 331/57; 327/538
See application file for complete search history.

(56) References Cited

U.S. PATENT DOCUMENTS

| | | | |
|---|---|---|---|
| 6,404,295 B1 * | 6/2002 | Minami et al. .................. | 331/57 |
| 6,954,110 B2 * | 10/2005 | Li .................................. | 331/57 |
| 7,391,276 B2 * | 6/2008 | Sakaguchi ...................... | 331/57 |
| 7,639,093 B2 * | 12/2009 | Ardehali ......................... | 331/57 |
| 7,642,867 B2 * | 1/2010 | Isik ................................. | 331/57 |
| 2007/0035337 A1 | 2/2007 | Kim et al. | |

FOREIGN PATENT DOCUMENTS

| | | |
|---|---|---|
| CN | 1549434 A | 11/2004 |
| CN | 1913361 A | 2/2007 |
| CN | 1968021 A | 5/2007 |
| JP | 2002-076856 A | 3/2002 |

OTHER PUBLICATIONS

State Intellectual Property Office of the People'Republic of China, Examination Report in Chinese Patent Application No. 200710146075.0 (Sep. 18, 2009).
Young et al., "A PLL Clock Generator with 5 to 110 MHz of Lock Range for Microprocessors," Nov. 1992, vol. 27, No. 11, IEEE Journal of Solid State Circuits, Piscataway, New Jersey.
Rau et al., "Clock/Data Recovery PLL Using Half-Frequency Clock," Jul. 1997, vol. 32, No. 7, IEEE Journal of Solid State Circuits, Piscataway, New Jersey.

* cited by examiner

*Primary Examiner* — Joseph Chang
(74) *Attorney, Agent, or Firm* — Leydig, Voit & Mayer, Ltd.

(57) ABSTRACT

A bias circuit and a voltage-controlled oscillator (VCO) thereof suitable for improving the stability of the bias circuit are provided. The bias circuit includes: an error amplifier circuit, having an inverting input terminal connected to a reference voltage; a voltage-controlled current source, having a voltage control terminal connected to a voltage output terminal of the error amplifier circuit, in which a current generated by the current source is controlled by a voltage at the voltage output terminal of the error amplifier circuit; a delay control circuit, having a current input terminal connected to the voltage-controlled current source, an output terminal connected to a non-inverting input terminal of the error amplifier circuit, and a voltage input terminal connected to a supply terminal of the control voltage, and the delay control circuit is adapted to adjust an output voltage of the delay control circuit according to a control voltage.

18 Claims, 3 Drawing Sheets

US 7,902,935 B2

BIAS CIRCUIT AND VOLTAGE-CONTROLLED OSCILLATOR

CROSS-REFERENCE TO RELATED APPLICATION

This application claims priority to Chinese Patent Application No. 200710146075.0, filed Sep. 7, 2007, which is hereby incorporated by reference in its entirety.

FIELD OF THE INVENTION

The present invention relates to the electronics field, and more particularly, to a bias circuit and a voltage-controlled oscillator (VCO).

BACKGROUND

With the development of chip technology, in practical applications, the system is gradually required to provide a clock having a plurality of frequencies to support the system applications when there is merely one reference clock. Therefore, the phase locked loop (PLL) with an adjustable output clock frequency is required, and the voltage-controlled oscillator (VCO) is required to have a wider oscillation range and to operate stably.

FIG. 1 shows a conventional bias circuit, in which the VCO control voltage is converted into a current through a voltage-to-current converter, and then the current is input into the bias circuit and a delay unit. Once the current is input into the bias circuit, a feedback voltage Vfeedback is generated. The Vfeedback is applied to a non-inverting input terminal of an error amplifier. A reference voltage is input into an inverting input terminal of the error amplifier, and accordingly, an output voltage of the error amplifier is a temporary voltage V. The temporary voltage V controls the resistance of a voltage-controlled resistor (VCR). In this technical solution, the oscillation range of the VCO is relevant to the delay time, and the delay time is relevant to the amount of the current and the resistance of the VCR. Therefore, the circuit performs a delay control on the delay unit through the current and the resistance of the voltage-controlled resistor to realize the oscillation of the VCO.

However, in the prior art, due to the converter circuit for converting the control voltage Vc into the current I, when the Vc is lower than the threshold for turning on/off the voltage-to-current converter, the input tube cannot be turned on, and as a result, the entire circuit cannot work normally.

Meanwhile, as the delay unit requires the cooperation of the current and the VCR to perform the delay control and to realize the oscillation of the VCO, the Vc needs to be converted into I, and then converted into the temporary voltage V. As a result, during the process of converting the Vc into V, the grain errors are likely to be introduced, and thus affecting the accuracy of the resistance of the VCR, and influencing the stability of the VCO.

SUMMARY

According to an embodiment of the present invention, a bias circuit and a voltage-controlled oscillator (VCO) are provided, which are suitable for improving the stability of the VCO.

According to an embodiment of the present invention, the bias circuit includes: an error amplifier circuit, having an inverting input terminal connected to a reference voltage; a voltage-controlled current source, having a voltage control terminal connected to a voltage output terminal of the error amplifier circuit, in which a current generated thereby is controlled by a voltage at the voltage output terminal of the error amplifier circuit; a delay control circuit, having a current input terminal connected to the voltage-controlled current source, an output terminal connected to a non-inverting input terminal of the error amplifier circuit, and a voltage input terminal connected to a supply terminal of a control voltage, in which the delay control circuit is adapted to adjust an output voltage of the delay control circuit according to a control voltage.

According to an embodiment of the present invention, the VCO includes: a reference voltage supply terminal, adapted to supply a reference voltage; a supply terminal of the control voltage, adapted to supply a control voltage; a bias circuit, adapted to generate an output voltage under the control of the reference voltage supplied by the reference voltage supply terminal and the control voltage supplied by the supply terminal of the control voltage; and a delay unit, adapted to generate a differential signal according to the output voltage of the error amplifier circuit and the control voltage output by the supply terminal of the control voltage.

As can be seen from the above technical solutions, the embodiments of the present invention have the following advantages.

According to an embodiment of the present invention, when the error amplifier circuit begins to work, a bias current is generated in the voltage-controlled current source tube, and the bias current is supplied to the delay control circuit, and meanwhile, a control voltage is directly applied to the delay control circuit. Therefore, a voltage-to-current converter circuit is not required in the embodiments of the present invention, so that the problem that the entire circuit cannot work normally because the input tube cannot be turned on does not occur, and meanwhile, no gain error is generated, thereby improving the stability of the bias circuit.

DETAILED DESCRIPTION

According to an embodiment of the present invention, a bias circuit and a VCO are provided, suitable for improving the stability of the VCO.

According to an embodiment of the present invention, the bias circuit may be applied to a PLL, which enables the VCO to have a wider oscillation range and have a stable circuit performance. It can be understood that the bias circuit can further be applied in other situations requiring the VCO to have a wider oscillation range.

Figure 1:
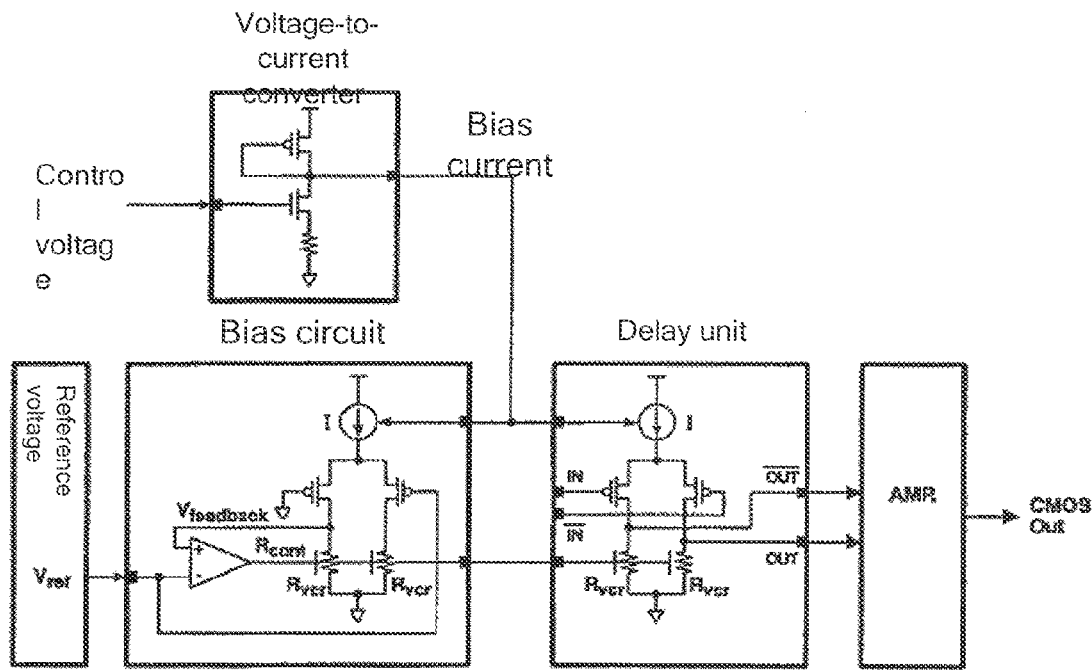
FIG. 1 is a schematic diagram of a bias circuit.
Figure 2:
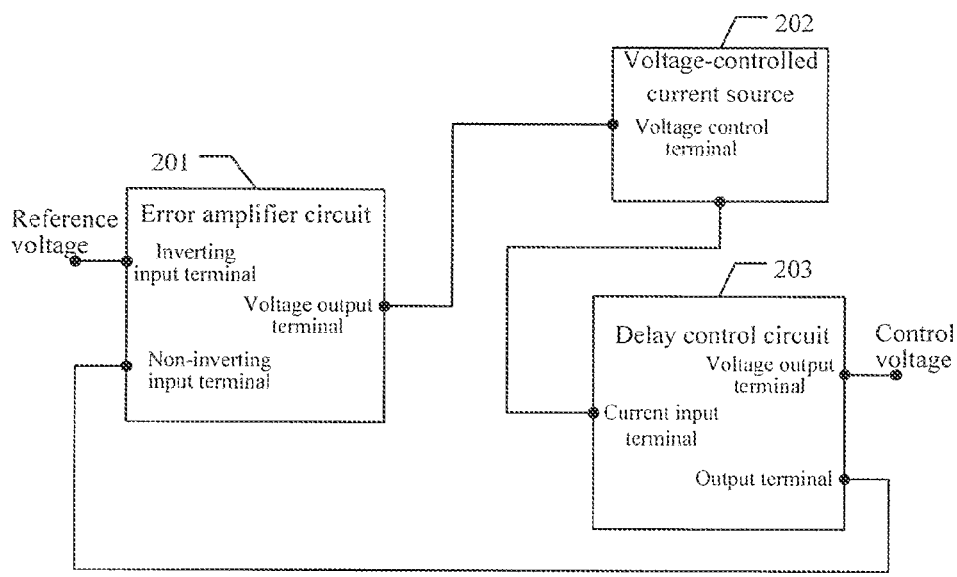
FIG. 2 is a general schematic diagram of a bias circuit according to an embodiment of the present invention.

Referring to FIG. 2, according to an embodiment of the present invention, the bias circuit mainly includes an error amplifier circuit 201, a voltage-controlled current source 202, and a delay control circuit 203.

The error amplifier circuit 201 has an inverting input terminal connected to a reference voltage.

The voltage-controlled current source 202 has a voltage control terminal connected to a voltage output terminal of the error amplifier circuit 201, in which a current generated by the voltage-controlled current source 202 is controlled by a voltage at the voltage output terminal of the error amplifier circuit 201.

The delay control circuit 203 has a current input terminal connected to the voltage-controlled current source 202, an output terminal connected to a non-inverting input terminal of the error amplifier circuit 201, and a voltage input terminal connected to a supply terminal of control voltage.

The delay control circuit 203 adjusts an output voltage of the delay control circuit according to the control voltage.

Hereafter, the bias circuit is described in detail according to the embodiments of the present invention. In the embodiment of the present invention, the voltage-controlled current source is a metal-oxide-semiconductor field-effect-transistor tube (MOSFET), hereafter is briefly called MOS tube. It can be understood that the voltage-controlled current source can also be implemented in other manners in other embodiment.

According to the type of the MOS tube that acts as the VCR, the bias circuit according to the embodiment of the present invention can be divided into two categories:

I. The NMOS tube is taken as the VCR.

Figure 3:
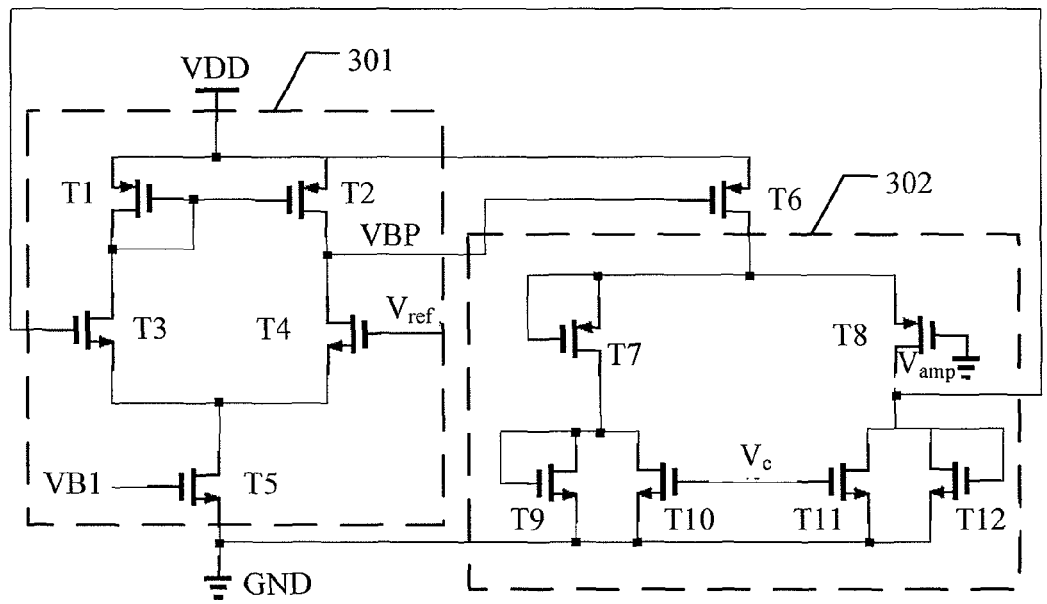
FIG. 3 is a schematic diagram of a bias circuit according to embodiment 1 of the present invention.

Referring to FIG. 3, according to a first embodiment of the present invention, the bias circuit includes 12 MOS tubes as shown in the figure.

MOS tubes T1 to T5 form an error amplifier circuit 301, and MOS tube T7 to T12 form a delay control circuit 302.

A voltage output terminal of the error amplifier circuit 301 is connected to a gate of the PMOS tube T6.

A drain of the MOS tube T6 is connected to a current input terminal of the delay control circuit 302, and a source is connected to a working voltage VDD supply terminal.

Once a VBP is applied to the gate of the MOS tube T6, a bias current is generated in the MOS tube T6, and the MOS tube T6 supplies the bias current to the delay control circuit 302.

An output terminal of the delay control circuit is connected to a non-inverting input terminal of the error amplifier circuit.

The structure of the error amplifier circuit 301 is described as follows.

The error amplifier circuit 301 includes: the non-inverting input terminal, an inverting input terminal, the voltage output terminal, and MOS tubes T1 to T5.

A gate of the PMOS tube T1 and a gate of the PMOS tube T2 are connected to form a current mirror, which serves as an active load of the error amplifier circuit 301, and a source of the MOS tube T1 and a source of the MOS tube T2 are both connected to the working voltage VDD supply terminal.

A gate of the NMOS tube T3 is connected to the non-inverting input terminal of the error amplifier circuit 301, a drain of the MOS tube T3 is connected to a drain of the MOS tube T1, and a source of T3 is connected to a drain of T5.

A gate of the NMOS tube T4 is connected to the inverting input terminal of the error amplifier circuit 301 and connected to a reference voltage $V_{ref}$, a drain of the MOS tube T4 is connected to a drain of the MOS tube T2, and a source of T4 is connected to the drain of T5.

The drain of T2 is connected to the drain of T4 and connected to the voltage output terminal of the error amplifier circuit 301.

In this embodiment, a bias current source of the error amplifier circuit 301 is formed by the NMOS tube T5 with a gate connected with a fixed voltage VB1. Definitely, the bias current source can also be provided in other manners, such as a band-gap current source.

In this embodiment, a gate of the MOS tube T5 is connected to an external bias voltage supply terminal, a drain of the MOS tube T5 is connected to the source of the MOS tube T3 and the source of the MOS tube T4, and a source of the MOS tube T5 is connected to the ground.

When the bias voltage VB1 is applied to the gate of the MOS tube T5, working current for the error amplifier circuit 301 is generated in the MOS tube T5, which is supplied to the error amplifier circuit 301.

The structure of the delay control circuit 302 is described as follows.

The delay control circuit 302 includes: an output terminal, and the MOS tubes T6 to T12.

The MOS tubes T7, T9, and T10 in the delay control circuit 302 are in a cut-off state.

The MOS tube T6 supplies bias current to the delay control circuit 302.

A drain of the MOS tube T6 is connected to a source of the PMOS tube T8, a gate of the MOS tube T8 is connected to the ground, and a drain of T8 is connected to the VCR and the output terminal of the delay control circuit 302.

In this embodiment, the VCR includes the NMOS tube T11 and the NMOS tube T12.

A source of the MOS tube T11 is connected to a source of the NMOS tube T12, a drain of T11 is connected to a drain of the MOS tube T12 and connected to the drain of the MOS tube T8. The MOS tubes T11 and T12 together form the VCR, in which a gate of T12 is connected to the drain, and the source is connected to the ground.

It can be understood that the VCR can also be implemented in other manners in other embodiments of the present invention.

When the delay control circuit 302 works normally, external control voltage is applied to the gate of the MOS tube T11, the drain of the MOS tube T11 and the drain of the MOS tube T12 are both connected to the output terminal of the delay control circuit 302, and the source of the MOS tube T11 is connected to the ground.

The sub-circuit structure formed by the MOS tubes T9 and T10 is symmetrical to that formed by the MOS tubes T11 and T12.

In the circuit structures of the embodiment, the MOS tubes T1, T2, T6, T7, and T8 are PMOS tubes, and the MOS tubes T3, T4, T5, T9, T10, T11 and T12 are NMOS tubes.

The operation process of the circuit according to the embodiments is described as follows.

When the bias voltage VB1, the reference voltage $V_{ref}$, the working voltage VDD, and the control voltage Vc are all generated, the error amplifier circuit begins to work normally. The MOS tube T5 supplies a current required by the error amplifier circuit during normal working. A voltage VBP is generated at the output terminal of the error amplifier circuit, and a bias current is generated in the MOS tube T6. Then, the MOS tube T6 inputs the generated bias current to the source of the MOS tube T8 in the delay control circuit through the drain of the MOS tube T6. When Vc is increased, the VCR is decreased, and the current supplied by the MOS tube T6 maintains unchanged, the $V_{amp}$ output by the delay control circuit is decreased. Since the $V_{amp}$ is connected to the non-inverting input terminal of the error amplifier circuit, when the $V_{amp}$ is decreased, the VBP output by the error amplifier circuit is also decreased, and accordingly, the current supplied by the MOS tube T6 is increased, thereby the $V_{amp}$ is increased, and finally, the $V_{amp}$ keeps the same voltage amplitude as the $V_{ref}$. Thus, the VCR is decreased, and the current of the MOS tube T6 is increased, such that the oscillation amplitude of the VCO keeps constant. According to the delay principle, the delay time is inversely proportional to the current in the MOS tube T6 and directly proportional to the resistance of the VCR, so when the VCR is decreased, and the current of the MOS tube T6 is increased, the delay time is reduced, and the oscillation frequency is increased.

On the contrary, when Vc is decreased, through the same feed-back loop, the $V_{amp}$ is finally stabilized at the same voltage amplitude as the $V_{ref}$.

II. The PMOS tube is taken as the VCR.

Figure 4:
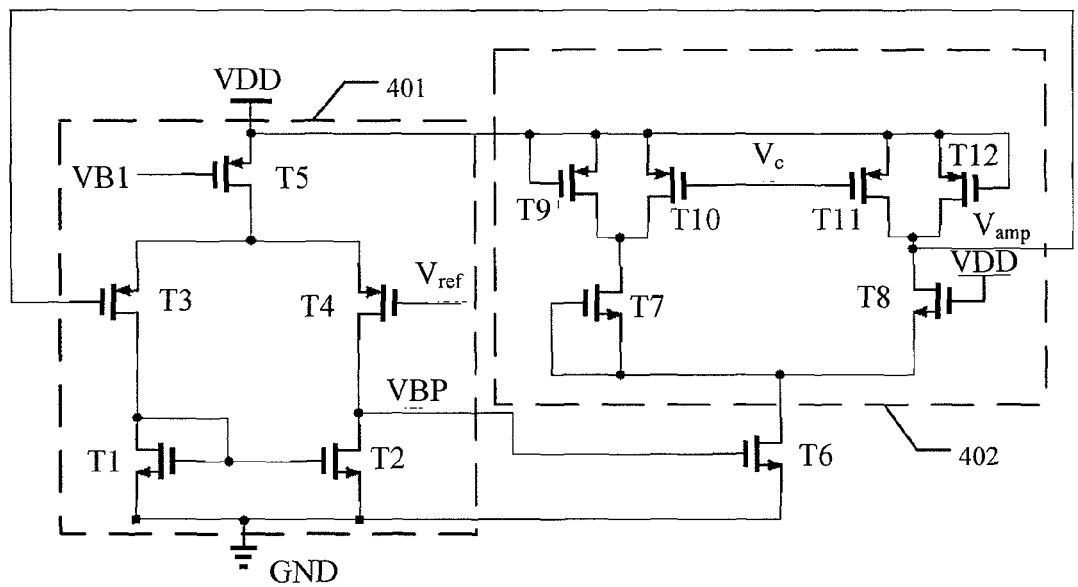
FIG. 4 is a schematic diagram of a bias circuit according to embodiment 2 of the present invention.

Referring to FIG. 4, according to a second embodiment of the present invention, the bias circuit includes twelve MOS tubes as shown in the figure.

MOS tubes T1 to T5 form an error amplifier circuit 401 and MOS tube T7 to T12 form a delay control circuit 402.

A voltage output terminal of the error amplifier circuit 401 is connected to a gate of the MOS tube T6.

A drain of the MOS tube T6 is connected to a current input terminal of the delay control circuit 402, and a source of the MOS tube T6 is connected to the ground.

Once a VBP is applied to a gate of the MOS tube T6, a bias current is generated in the MOS tube T6, and the MOS tube T6 supplies the bias current to the delay control circuit 402.

An output terminal of the delay control circuit 402 is connected to a non-inverting input terminal of the error amplifier circuit 401.

The structure of the error amplifier circuit 401 is described as follows.

The error amplifier circuit 401 includes: the non-inverting input terminal, an inverting input terminal, the voltage output terminal, and the MOS tubes T1 to T5.

A gate of the MOS tube T1 and a gate of the MOS tube T2 are connected to form a current mirror, which serves as an active load of the error amplifier circuit 401, and a source of the MOS tube T1 and a source of the MOS tube T2 are both connected to the ground.

A gate of the MOS tube T3 is connected to the non-inverting input terminal of the error amplifier circuit 401, a drain of the MOS tube T3 is connected to a drain of the MOS tube T1, and a source of the MOS tube T3 is connected to a drain of the MOS tube T5.

A gate of the MOS tube T4 is connected to the inverting input terminal of the error amplifier circuit 401, a drain of the MOS tube T4 is connected to a drain of the MOS tube T2, and a source of the MOS tube T4 is connected to the drain of the MOS tube T5.

The drain of the MOS tube T2 and the drain of the MOS tube T4 are both connected to the voltage output terminal of the error amplifier circuit 401.

The MOS tube T5 serves as a second voltage-controlled current source tube, and particularly, a gate of the MOS tube T5 is connected to an external bias voltage supply terminal, the drain of the MOS tube T5 is connected to the source of the MOS tube T3 and the source of the MOS tube T4, and a source of the MOS tube T5 is connected to the working voltage VDD supply terminal.

When a bias voltage VB1 is applied to the gate of the MOS tube T5, a working current for the error amplifier circuit 401 is generated in the MOS tube T5.

The structure of the delay control circuit 402 is described as follows.

The delay control circuit 402 includes: an output terminal, and the MOS tubes T6 to T12.

The MOS tubes T7, T9, and T10 in the delay control circuit 402 are in a cut-off state.

The MOS tube T6 supplies a bias current for the delay control circuit 402.

The drain of the MOS tube T6 is connected to the source of the MOS tube T8, a gate of the MOS tube T8 is connected to the working voltage VDD supply terminal, and a drain of the MOS tube T8 is connected to the VCR and the output terminal of the delay control circuit 402.

In this embodiment, the VCR includes a PMOS tube T11 and a PMOS tube T12.

A source of the MOS tube T11 is connected to a source of the MOS tube T12, and a drain of T11 is connected to a drain of the MOS tube T12. The MOS tubes T11 and T12 form the VCR together, where a gate of T12 is connected to the source of itself, and meanwhile, the source of T12 is connected to the working voltage VDD supply terminal. It can be understood that the VCR can also be implemented in other manners.

When the delay control circuit 402 works normally, an external control voltage is applied to the gate of T11, the drain of the MOS tube T11 is connected to the drain of the MOS tube T12 and connected to the output terminal of the delay control circuit 402, and the source of the MOS tube T11 is connected to the working voltage VDD supply terminal.

The sub-circuit structure formed by the MOS tubes T9 and T10 is symmetrical to that formed by the MOS tubes T11 and T12.

In this embodiment, the MOS tubes T1, T2, T6, T7, and T8 are NMOS tubes, and the MOS tubes T3, T4, T5, T9, T10, T11 and T12 are PMOS tubes.

The operation process of the circuit according to the embodiments is described as follows.

When the bias voltage VB1, the reference voltage $V_{ref}$, the working voltage VDD, and the control voltage Vc are all generated, the error amplifier circuit works normally.

The MOS tubes T5 supplies working current for the error amplifier circuit. Voltage VBP is generated at the output terminal of the error amplifier circuit, and the bias current is generated in the MOS tube T6. Then, the MOS tube T6 inputs the generated bias current to the source of T8 in the delay control circuit through the drain of the MOS tube T6.

When Vc is increased, the VCR is increased, and assuming that the current supplied by the MOS tube T6 maintains unchanged, the $V_{amp}$ output by the delay control circuit is decreased. Since the $V_{amp}$ is connected to the non-inverting input terminal of the error amplifier circuit, when the $V_{amp}$ is decreased, the VBP output by the error amplifier circuit is also decreased, and accordingly, the current supplied by the MOS tube T6 is increased, thereby the $V_{amp}$ is increased, and finally, the $V_{amp}$ keeps the same voltage amplitude as the $V_{ref}$. Thus, the VCR is increased, and the current of the MOS tube T6 is decreased, so that the oscillation amplitude of the VCO keeps constant. According to the delay principle, the delay time is inversely proportional to the current in the MOS tube T6 and directly proportional to the resistance of the VCR, so that when the VCR is increased, and the current of the MOS tube T6 is decreased, the delay time is prolonged, and the oscillation frequency is reduced.

On the contrary, when Vc is decreased, the delay time is reduced, the oscillation frequency is increased, and through the same feed-back loop, the $V_{amp}$ is finally stabilized at the same voltage amplitude as the $V_{ref}$.

The delay time of DC is inversely proportional to the bias current I and directly proportional to the VCR. When the Vc is increased, the VCR is decreased, the bias current is increased, and thus the delay time is reduced; when the Vc is decreased, the VCR is increased, the bias current is decreased, and thus the delay time is prolonged, thereby obtaining a wider frequency range.

As recited in the aforementioned embodiments, the bias circuit according to the embodiments of the present invention does not need a voltage-to-current converter circuit, so that the problem that the entire circuit cannot work normally because the input tube cannot be turned on does not occur any more, and meanwhile, no gain error is generated, thereby improving the stability of the bias circuit.

Figure 5:
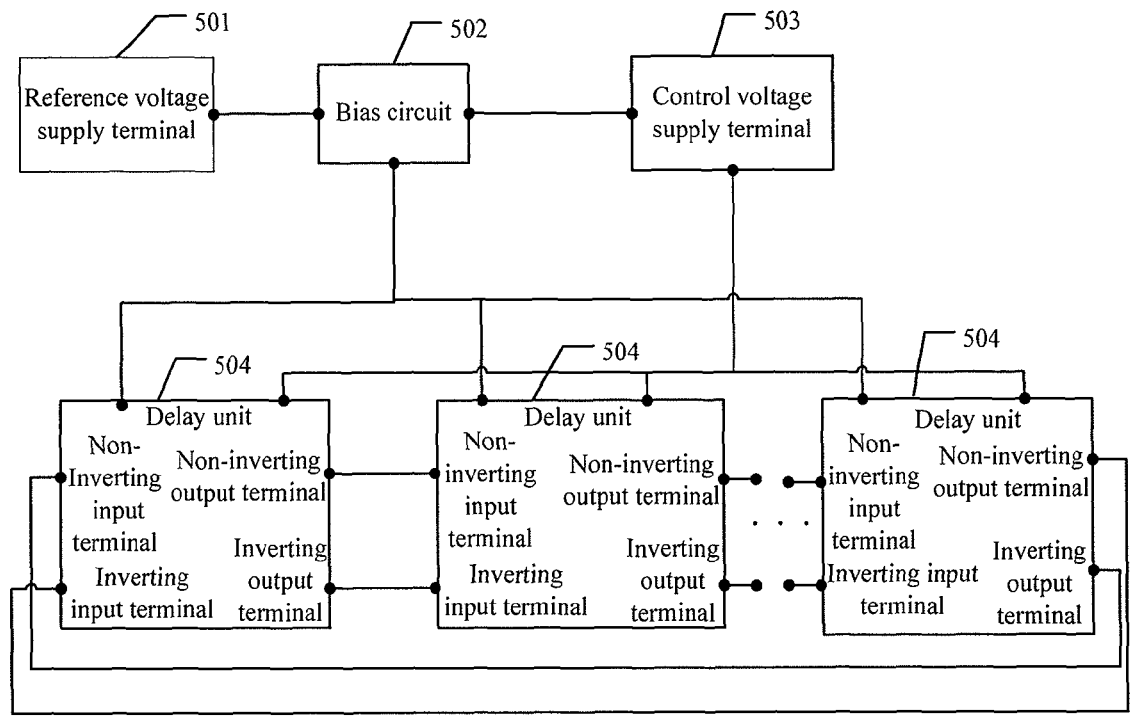
FIG. 5 is a schematic diagram of a voltage-controlled oscillator (VCO) according to an embodiment of the present invention.

Referring to FIG. 5, it shows schematic diagram of the VCO according to an embodiment of the present invention, the VCO includes a reference voltage supply terminal 501, a supply terminal of the control voltage 503, a bias circuit 502, and a delay unit 504.

The reference voltage supply terminal 501 is adapted to provide a reference voltage.

The supply terminal of the control voltage 503 is adapted to provide a control voltage.

The bias circuit 502 is adapted to generate an output voltage under the control of the reference voltage supplied by the reference voltage supply terminal 501 and the control voltage supplied by the supply terminal of the control voltage 503.

The delay unit 504 is adapted to generate a differential signal according to the output voltage of the bias circuit 502 and the control voltage output by the supply terminal of the control voltage 503.

The bias circuit 502 includes an error amplifier circuit, a voltage-controlled current source, and a delay control circuit.

The error amplifier circuit has an inverting input terminal connected to a reference voltage.

The voltage-controlled current source has a voltage control terminal connected to a voltage output terminal of the error amplifier circuit, in which a current generated by the voltage-controlled current source is controlled by a voltage at the voltage output terminal of the error amplifier circuit.

The delay control circuit has a current input terminal connected to the voltage-controlled current source, an output terminal connected to a non-inverting input terminal of the error amplifier circuit, and a voltage input terminal connected to a supply terminal of the control voltage.

The delay control circuit adjusts an output voltage of the delay control circuit according to a control voltage.

In this embodiment, the implementation of the bias circuit 502 is the same as that shown in FIG. 2, which is not repeatedly described herein.

Figure 6:
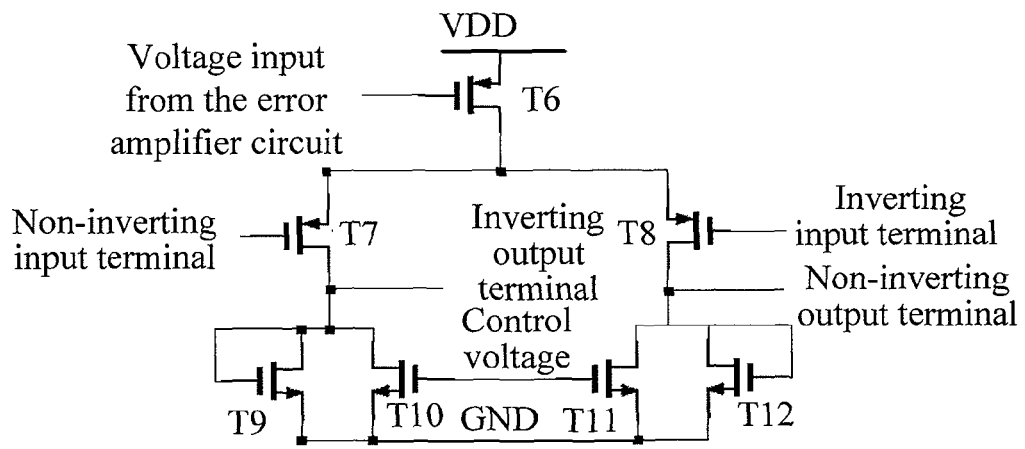
FIG. 6 is a schematic diagram of a delay unit in the VCO according to an embodiment of the present invention.

In this embodiment, the structure of the delay unit 504 in the VCO is as shown in FIG. 6, in which the functions and working flows of MOS tubes T6 to MOS tube T12 are the same as those of MOS tubes T6 to T12 in FIG. 3, which are not repeatedly described herein.

The operation flow of the VCO according to the embodiments of the present invention is described as follows.

First, a voltage VBP generated by the bias circuit and a Vc are respectively connected to the corresponding nodes of each delay unit of the VCO, where the number of delay units in the VCO is N (N is a positive integer that is larger than or equal to 3).

The non-inverting output terminal (VO+) and the inverting output terminal (VO−) of the Nth delay unit are respectively connected to the inverting input terminal (VI−) and the non-inverting input terminal (VI+) of the 1st delay unit, so as to generate a phase shift of 180 degrees.

The VO+ and the VO− of the 1st delay unit are respectively connected to the VI+ and the VI− of the 2nd delay unit, and so forth, till the Nth delay unit is also connected in the same way. From the 1st delay unit to the Nth delay unit, each delay unit generates a 180/N phase shift, and totally 180 phase shift is generated, and thus forming a positive feedback. As long as the gain of each delay unit satisfies $$A \geq \sqrt{1 + \tan^2 \frac{\pi}{N}},$$

the oscillation conditions are satisfied, thereby generating oscillation.

It can be understood that, the working principle can also be implemented in the following manner.

The non-inverting output terminal (VO+) and the inverting output terminal (VO−) of the Nth delay unit are respectively connected to the inverting input terminal (VI−) and the non-inverting input terminal (VI+) of the 1st delay unit.

The VO+ and the VO− of the 1st delay unit are respectively connected to the VI− and the VI+ of the 2nd delay unit, and so forth, till the Nth delay unit is connected in the same way.

The delay time td of each delay unit is directly proportional to the load capacitance C after each delay unit and the oscillation amplitude $V_{amp}$, and is inversely proportional to the tail current Ictrl, and thus the frequency can be changed merely by changing the tail current through the bias circuit.

In practice, the VCO circuit can be connected in many manners, and the above described manner is merely an example.

Herein, the bias circuit and the VCO of the present invention have been described in detail. It will be apparent to those skilled in the art that various modifications and variations can be made without departing from the scope or spirit of the invention. In view of the foregoing, it is intended that the present invention cover modifications and variations of this invention provided that they fall within the scope of the following claims and their equivalents.

What is claimed is:

1. A bias circuit, comprising:
   an error amplifier circuit, having an inverting input terminal connected to a reference voltage;
   a voltage-controlled current source, having a voltage control terminal connected to a voltage output terminal of the error amplifier circuit, wherein the current amount of the voltage-controlled current source is controlled by a voltage at the voltage output terminal of the error amplifier circuit; and
   a delay control circuit, having a current input terminal connected to the voltage-controlled current source, an output terminal connected to a non-inverting input terminal of the error amplifier circuit, and a voltage input terminal connected to a supply terminal of the control voltage; wherein
   the delay control circuit is adapted to adjust an output voltage of the delay control circuit according to the control voltage.

2. The bias circuit according to claim 1, wherein
   the voltage-controlled current source is a Negative Metal-Oxide-Semiconductor (NMOS) tube, with a gate connected to the voltage output terminal of the error amplifier circuit, a drain connected to the current input terminal of the delay control circuit, and a source connected to the ground.

3. The bias circuit according to claim 2, wherein the error amplifier circuit comprises:
   a non-inverting input terminal;
   an inverting input terminal;
   a voltage output terminal;
   a first Metal-Oxide-Semiconductor (MOS) tube;
   a second MOS tube, having a gate connected to a gate of the first MOS tube, and a source connected to a source of the first MOS tube, wherein the gate of the first MOS tube is connected to a drain of itself;
a third MOS tube, having a gate connected to the non-inverting input terminal, and a drain connected to the drain of the first MOS tube;
a fourth MOS tube, having a gate connected to the inverting input terminal, and a drain connected to a drain of the second MOS tube, wherein the drain of the second MOS tube and the drain of the fourth MOS tube are connected to the voltage output terminal; and
a fifth MOS tube, having a gate connected to a bias voltage, and a drain connected to a source of the third MOS tube and a source of the fourth MOS tube;
wherein, when the voltage-controlled current source tube is a NMOS tube, a source of the fifth MOS tube is connected to the working voltage supply terminal; when the voltage-controlled current source tube is a PMOS tube, the source of the fifth MOS tube is connected to the ground.

4. The bias circuit according to claim 1, wherein
the voltage-controlled current source is a Positive Metal-Oxide-Semiconductor (PMOS) tube, with a gate connected to the voltage output terminal of the error amplifier circuit, a drain connected to the current input terminal of the delay control circuit, and a source connected to a working voltage supply terminal.

5. The bias circuit according to claim 4, wherein the error amplifier circuit comprises:
a non-inverting input terminal;
an inverting input terminal;
a voltage output terminal;
a first Metal-Oxide-Semiconductor (MOS) tube;
a second MOS tube, having a gate connected to a gate of the first MOS tube, and a source connected to a source of the first MOS tube, wherein the gate of the first MOS tube is connected to a drain of itself;
a third MOS tube, having a gate connected to the non-inverting input terminal, and a drain connected to the drain of the first MOS tube;
a fourth MOS tube, having a gate connected to the inverting input terminal, and a drain connected to a drain of the second MOS tube, wherein the drain of the second MOS tube and the drain of the fourth MOS tube are connected to the voltage output terminal; and
a fifth MOS tube, having a gate connected to a bias voltage, and a drain connected to a source of the third MOS tube and a source of the fourth MOS tube;
wherein, when the voltage-controlled current source tube is a NMOS tube, a source of the fifth MOS tube is connected to the working voltage supply terminal; when the voltage-controlled current source tube is a PMOS tube, the source of the fifth MOS tube is connected to the ground.

6. The bias circuit according to claim 1, wherein the delay control circuit comprises:
an output terminal;
a sixth MOS tube, having a drain connected to the output terminal, a source connected to the voltage-controlled current source, and a gate connected to the ground; and
a voltage-controlled resistor, connected to the sixth MOS tube, wherein a control voltage is applied to a voltage control terminal of the voltage-controlled resistor.

7. The bias circuit according to claim 6, wherein the voltage-controlled resistor comprises:
a seventh MOS tube, having a gate applied with the control voltage; and
an eighth MOS tube, having a drain connected to a drain of the seventh MOS tube, a source connected to a source of the seventh MOS tube and connected to the ground, and a gate connected to the drain of itself.

8. The bias circuit according to claim 1, wherein the delay control circuit comprises:
an output terminal;
a sixth MOS tube, having a drain connected to the output terminal, a source connected to the voltage-controlled current source, and a gate connected to a working voltage supply terminal; and
a voltage-controlled resistor, connected to the sixth MOS tube, wherein a control voltage is applied to a voltage control terminal of the voltage-controlled resistor.

9. The bias circuit according to claim 8, wherein the voltage-controlled resistor comprises:
a seventh MOS tube, having a gate applied with the control voltage; and
an eighth MOS tube, having a drain connected to a drain of the seventh MOS tube, a source connected to a source of the seventh MOS tube and connected to the working voltage supply terminal, and a gate connected to the source of itself.

10. A voltage-controlled oscillator (VCO), comprising:
a reference voltage supply terminal, adapted to provide a reference voltage;
a supply terminal of a control voltage, adapted to provide the control voltage;
a bias circuit, adapted to generate an output voltage under the control of the reference voltage supplied by the reference voltage supply terminal and the control voltage supplied by the supply terminal of the control voltage;
a delay unit, adapted to generate a differential signal according to the output voltage of an error amplifier circuit and the control voltage output by the supply terminal of the control voltage;
an error amplifier circuit, having an inverting input terminal connected to the reference voltage;
a voltage-controlled current source, having a voltage control terminal connected to a voltage output terminal of the error amplifier circuit, wherein the current amount of the voltage-controlled current source is controlled by a voltage at the voltage output terminal of the error amplifier circuit;
a delay control circuit, having a current input terminal connected to the voltage-controlled current source, an output terminal connected to a non-inverting input terminal of the error amplifier circuit, and a voltage input terminal connected to the supply terminal of the control voltage; wherein
the delay control circuit is adapted to adjust an output voltage of the delay control circuit according to the control voltage.

11. The voltage-controlled oscillator according to claim 10, wherein
the voltage-controlled current source is a Negative Metal-Oxide-Semiconductor (NMOS) tube, with a gate connected to the voltage output terminal of the error amplifier circuit, a drain connected to the current input terminal of the delay control circuit, and a source connected to the ground.

12. The voltage-controlled oscillator according to claim 11, wherein the error amplifier circuit comprises:
a non-inverting input terminal;
an inverting input terminal;
a voltage output terminal;
a first Metal-Oxide-Semiconductor (MOS) tube;

a second MOS tube, having a gate connected to a gate of the first MOS tube, and a source connected to a source of the first MOS tube, wherein the gate of the first MOS tube is connected to a drain of itself;

a third MOS tube, having a gate connected to the non-inverting input terminal, and a drain connected to the drain of the first MOS tube;

a fourth MOS tube, having a gate connected to the inverting input terminal, and a drain connected to a drain of the second MOS tube, wherein the drain of the second MOS tube and the drain of the fourth MOS tube are connected to the voltage output terminal; and a fifth MOS tube, having a gate connected to a bias voltage, and a drain connected to a source of the third MOS tube and a source of the fourth MOS tube;

wherein, when the voltage-controlled current source tube is a NMOS tube, a source of the fifth MOS tube is connected to the working voltage supply terminal; when the voltage-controlled current source tube is a PMOS tube, the source of the fifth MOS tube is connected to the ground.

13. The voltage-controlled oscillator according to claim 10, wherein the voltage-controlled current source is a Positive Metal-Oxide-Semiconductor (PMOS) tube, with a gate connected to the voltage output terminal of the error amplifier circuit, a drain connected to the current input terminal of the delay control circuit, and a source connected to a working voltage supply terminal.

14. The voltage-controlled oscillator according to claim 13, wherein the error amplifier circuit comprises:

a non-inverting input terminal;
an inverting input terminal;
a voltage output terminal;
a first Metal-Oxide-Semiconductor (MOS) tube;
a second MOS tube, having a gate connected to a gate of the first MOS tube, and a source connected to a source of the first MOS tube, wherein the gate of the first MOS tube is connected to a drain of itself;

a third MOS tube, having a gate connected to the non-inverting input terminal, and a drain connected to the drain of the first MOS tube;

a fourth MOS tube, having a gate connected to the inverting input terminal, and a drain connected to a drain of the second MOS tube, wherein the drain of the second MOS tube and the drain of the fourth MOS tube are connected to the voltage output terminal; and a fifth MOS tube, having a gate connected to a bias voltage, and a drain connected to a source of the third MOS tube and a source of the fourth MOS tube;

wherein, when the voltage-controlled current source tube is a NMOS tube, a source of the fifth MOS tube is connected to the working voltage supply terminal; when the voltage-controlled current source tube is a PMOS tube, the source of the fifth MOS tube is connected to the ground.

15. The voltage-controlled oscillator according to claim 10, wherein the delay control circuit comprises:

an output terminal;
a sixth MOS tube, having a drain connected to the output terminal, a source connected to the voltage-controlled current source, and a gate connected to the ground; and
a voltage-controlled resistor, connected to the sixth MOS tube, wherein a control voltage is applied to a voltage control terminal of the voltage-controlled resistor.

16. The voltage-controlled oscillator according to claim 15, wherein the voltage-controlled resistor comprises:

a seventh MOS tube, having a gate applied with the control voltage; and
an eighth MOS tube, having a drain connected to a drain of the seventh MOS tube, a source connected to a source of the seventh MOS tube and connected to the ground, and a gate connected to the drain of itself.

17. The voltage-controlled oscillator according to claim 10, wherein the delay control circuit comprises:

an output terminal;
a sixth MOS tube, having a drain connected to the output terminal, a source connected to the voltage-controlled current source, and a gate connected to a working voltage supply terminal; and
a voltage-controlled resistor, connected to the sixth MOS tube, wherein a control voltage is applied to a voltage control terminal of the voltage-controlled resistor.

18. The voltage-controlled oscillator according to claim 17, wherein the voltage-controlled resistor comprises:

a seventh MOS tube, having a gate applied with the control voltage; and
an eighth MOS tube, having a drain connected to a drain of the seventh MOS tube, a source connected to a source of the seventh MOS tube and connected to the working voltage supply terminal, and a gate connected to the source of itself.

* * * * *